United States Patent
Sawai

(10) Patent No.: US 11,342,308 B2
(45) Date of Patent: May 24, 2022

(54) SEMICONDUCTOR DEVICE AND MANUFACTURING METHOD FOR SEMICONDUCTOR DEVICE

(71) Applicant: SHARP KABUSHIKI KAISHA, Sakai (JP)

(72) Inventor: Keiichi Sawai, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 48 days.

(21) Appl. No.: 16/618,056

(22) PCT Filed: Apr. 4, 2018

(86) PCT No.: PCT/JP2018/014411
§ 371 (c)(1),
(2) Date: Nov. 27, 2019

(87) PCT Pub. No.: WO2018/220998
PCT Pub. Date: Dec. 6, 2018

(65) Prior Publication Data
US 2021/0134758 A1    May 6, 2021

(30) Foreign Application Priority Data
May 30, 2017    (JP) .............................. JP2017-107035

(51) Int. Cl.
*H01L 25/065*    (2006.01)
*H01L 23/00*    (2006.01)
*H01L 25/00*    (2006.01)

(52) U.S. Cl.
CPC .......... *H01L 25/0657* (2013.01); *H01L 24/13* (2013.01); *H01L 24/16* (2013.01);
(Continued)

(58) Field of Classification Search
CPC . H01L 2224/0401; H01L 24/81; H01L 24/16; H01L 24/11
See application file for complete search history.

(56) References Cited

U.S. PATENT DOCUMENTS 6,635,969 B1    10/2003  Nakamura
10,643,931 B2 *  5/2020  Ha .......................... H01L 24/13
(Continued)

FOREIGN PATENT DOCUMENTS

JP    S64-089345 A    4/1989
JP    H06-268016 A    9/1994
(Continued)

*Primary Examiner* — Bradley Smith
*Assistant Examiner* — David J Goodwin
(74) *Attorney, Agent, or Firm* — ScienBiziP, P.C.

(57) ABSTRACT

A semiconductor device is provided with a first semiconductor chip and a second semiconductor chip that are arranged so as to oppose each other. The first semiconductor chip has a first connecting portion provided in a first hole portion, and the second semiconductor chip has an electrically conductive second connecting portion that is composed of a concave metal film formed on the front surface of a second electrode portion, the side surface of a second hole portion, and the front surface of a second protective film. The first electrode portion and the second electrode portion are electrically connected via the first connecting portion and the second connecting portion.

9 Claims, 11 Drawing Sheets

(52) U.S. Cl.
CPC .............. *H01L 24/81* (2013.01); *H01L 25/50* (2013.01); *H01L 2224/13019* (2013.01); *H01L 2224/16145* (2013.01); *H01L 2224/81193* (2013.01); *H01L 2225/06513* (2013.01); *H01L 2225/06558* (2013.01)

(56) References Cited

U.S. PATENT DOCUMENTS

| | | | |
|---|---|---|---|
| 2003/0146518 A1 | 8/2003 | Hikita et al. | |
| 2006/0108685 A1* | 5/2006 | Tsou | H01L 21/563 |
| | | | 257/737 |
| 2014/0027900 A1* | 1/2014 | Chiu | H01L 25/50 |
| | | | 257/737 |
| 2015/0115440 A1* | 4/2015 | Higuchi | H01L 23/481 |
| | | | 257/737 |

FOREIGN PATENT DOCUMENTS

| | | |
|---|---|---|
| JP | 2000-243904 A | 9/2000 |
| JP | 2000-252413 A | 9/2000 |
| JP | 2004-158701 A | 6/2004 |
| JP | 2014-154603 A | 8/2014 |
| WO | 2014/033977 A1 | 3/2014 |

\* cited by examiner

SEMICONDUCTOR DEVICE AND MANUFACTURING METHOD FOR SEMICONDUCTOR DEVICE

INCORPORATION BY REFERENCE

The present application claims the benefit of priority from Japanese Patent Application No. 2017-107035 filed on May 30, 2017, the entire contents of which are incorporated herein.

TECHNICAL FIELD

The present invention relates to a semiconductor device and a manufacturing method for a semiconductor device.

BACKGROUND ART

PTL 1 discloses a semiconductor device provided with a bump electrode for external connection. In this integrated circuit device, recesses are provided in locations corresponding to bump electrodes on a wiring conductor side of a mounting counterpart, and by fitting the bump electrodes into these recesses, a chip of the semiconductor device is positioned on the mounting counterpart, and thereafter the bump electrodes are joined to the wiring conductor of the mounting counterpart.

Furthermore, PTL 2 discloses an electronic component provided with component terminals composed of stud bumps. In this electronic component, the component terminals have recessed portions, and the component terminals are joined to substrate terminals of a mounting substrate with the tip ends of the substrate terminals being fitted into these recessed portions.

CITATION LIST

Patent Literature
PTL 1: Japanese Unexamined Patent Application Publication No. 6-268016
PTL 2: Japanese Unexamined Patent Application Publication No. 2014-154603

SUMMARY OF INVENTION

Technical Problem

However, in the semiconductor device of PTL 1, a step is required to form recesses in the wiring conductor by a procedure such as etching, and therefore the manufacturing process becomes complex. Consequently, there is a risk of it not being possible to easily manufacture the semiconductor device.

Furthermore, for the electronic component of PTL 2 also, a step is required to form the recessed portions in the component terminals by pressurizing a shaping tool which is provided with a shaping protruding portion having a square pyramid shape that is formed by means of silicon crystal anisotropic etching. Consequently, there is a risk of it not being possible to easily manufacture the electronic component.

Thus, the task of the present invention is to provide a semiconductor device that can be easily manufactured.
Solution to Problem A semiconductor device of one aspect of the present invention is provided with a first semiconductor chip and a second semiconductor chip arranged so as to oppose each other,
the first semiconductor chip having:
a first electrode portion that is provided on an opposing surface that opposes the second semiconductor chip; and
a first protective film that is arranged in a portion opposing the second semiconductor chip and is provided with a first hole portion in which the first electrode portion is exposed, and
the second semiconductor chip having:
a second electrode portion that is provided on an opposing surface that opposes the first semiconductor chip; and
a second protective film that is arranged in a portion opposing the first semiconductor chip and is provided with a second hole portion in which the second electrode portion is exposed,
in which the first semiconductor chip has an electrically conductive first connecting portion that is provided in the first hole portion and protrudes from the first hole portion toward the second hole portion,
the second semiconductor chip has an electrically conductive second connecting portion that is composed of a concave metal film formed on a front surface of the second electrode portion, a side surface of the second hole portion, and a front surface of the second protective film, and
the first electrode portion and the second electrode portion are electrically connected via the first connecting portion and the second connecting portion.

Furthermore, in a manufacturing method for a semiconductor device of one aspect of the present invention,
the semiconductor device is provided with a first semiconductor chip and a second semiconductor chip arranged so as to oppose each other,
the first semiconductor chip has:
a first electrode portion that is provided on an opposing surface that opposes the second semiconductor chip; and
a first protective film that is arranged in a portion opposing the second semiconductor chip and is provided with a first hole portion in which the first electrode portion is exposed,
the second semiconductor chip has:
a second electrode portion that is provided on an opposing surface that opposes the first semiconductor chip; and
a second protective film that is arranged in a portion opposing the first semiconductor chip and is provided with a second hole portion in which the second electrode portion is exposed,
the first semiconductor chip has an electrically conductive first connecting portion that is provided in the first hole portion and protrudes from the first hole portion toward the second hole portion,
the second semiconductor chip has an electrically conductive second connecting portion that is composed of a concave metal film formed on a front surface of the second electrode portion, a side surface of the second hole portion, and a front surface of the second protective film, and
the first electrode portion and the second electrode portion are electrically connected via the first connecting portion and the second connecting portion,
in which the manufacturing method includes:
a step in which the first electrode portion is formed on the first semiconductor chip, the first protective film is formed so as to cover the first electrode portion, and thereafter the first hole portion is formed so that the first electrode portion is exposed;

a step in which the second electrode portion is formed on the second semiconductor chip, the second protective film is formed so as to cover the second electrode portion, and thereafter the second hole portion is formed so that the second electrode portion is exposed;

a step in which a metal film is deposited in the first hole portion to form the first connecting portion; and a step in which a metal film is deposited on the front surface of the second electrode portion, the side surface of the second hole portion, and the front surface of the second protective film to form the second connecting portion.

Advantageous Effects of Invention

According to the semiconductor device of the aforementioned aspect, the second connecting portion composed of a concave metal film can be formed by a metal film being deposited on the front surface of the second electrode portion, the side surface of the second hole portion, and the front surface of the second protective film, for example, and therefore the manufacturing process can be simplified with a hole forming step for forming the second connecting portion being omitted. As a result, it is possible to provide a semiconductor device that can be easily manufactured. In other words, a concave shape is achieved by merely depositing a metal film on the front surface of the second electrode portion, the side surface of the second hole portion, and the front surface of the second protective film.

According to the manufacturing method for the semiconductor device of the aforementioned aspect, the second connecting portion composed of a concave metal film is formed by a metal film being deposited on the front surface of the second electrode portion, the side surface of the second hole portion, and the front surface of the second protective film, and therefore it is not necessary to form a hole for forming the second connecting portion, and the manufacturing process can be simplified. Consequently, the semiconductor device can be easily manufactured.

DESCRIPTION OF EMBODIMENTS

Hereinafter, embodiments according to the present invention will be described in accordance with the appended drawings. In the description given hereinafter, words indicating specific directions or positions are used as necessary (words including "up", "down", "side", and "end", for example); however, it should be noted that these words are used to facilitate an understanding of the invention with reference to the drawings, and the technical scope of the present invention is not restricted by the meanings of such words. Furthermore, the description given hereinafter is essentially merely an exemplification, and is not intended to restrict the present invention, the application thereof, or the use thereof. In addition, the drawings are schematic, and the ratios of the dimensions and the like are different from those in reality.

First Embodiment

Figure 1:
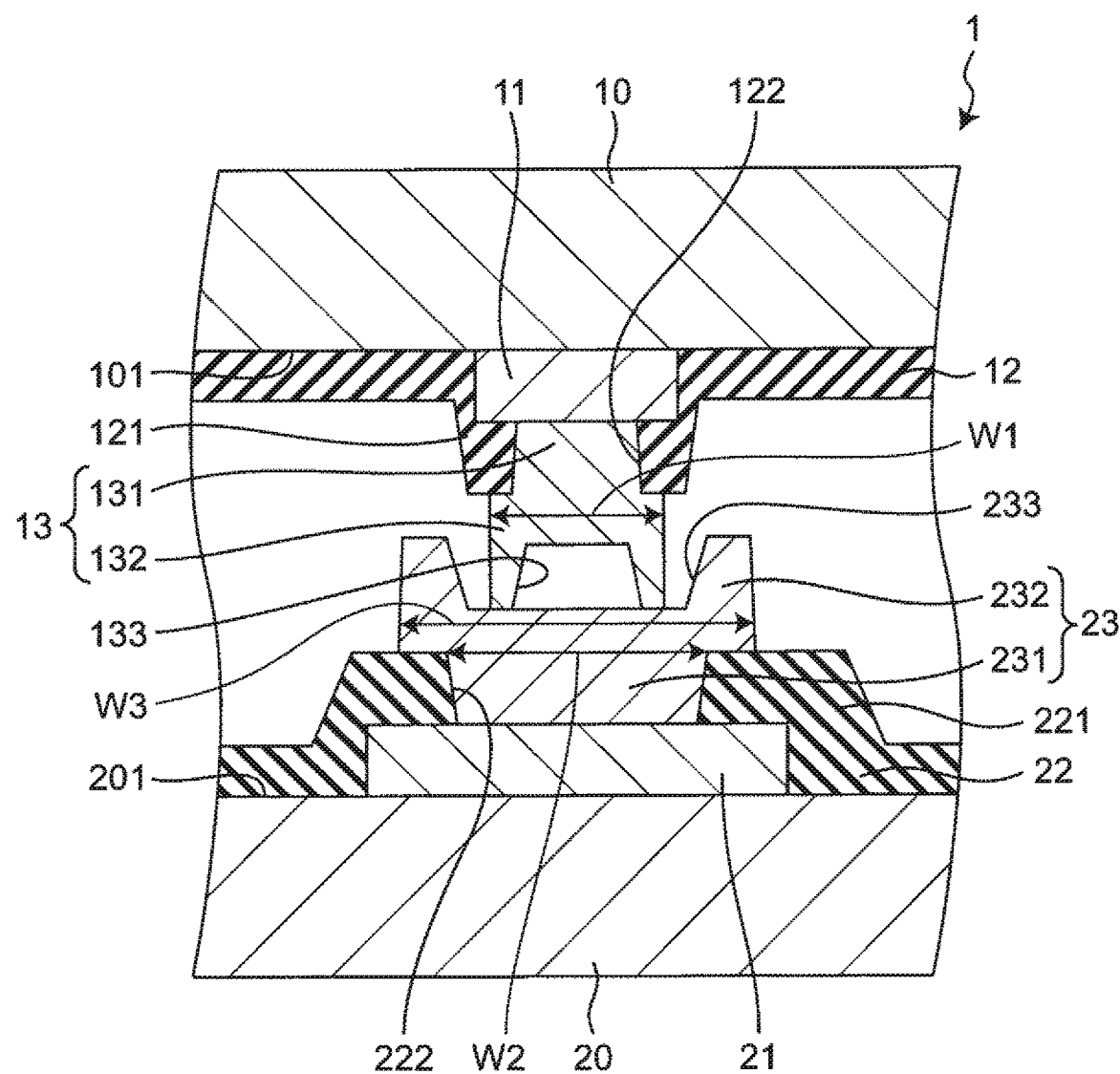
FIG. 1 is a cross-sectional schematic view of a semiconductor device of a first embodiment of the present invention.

A semiconductor device 1 of a first embodiment of the present invention is provided with a first semiconductor chip 10 and a second semiconductor chip 20 that are arranged so as to oppose each other, as depicted in FIG. 1. The first semiconductor chip 10 is an LED (in other words, a light-emitting diode), for example, and the second semiconductor chip 20 is an LSI (large-scale integrated circuit), for example.

The first semiconductor chip 10 has an electrically conductive first electrode portion 11, an insulating first protective film 12, and an electrically conductive first bump 13. It should be noted that the first bump 13 is an example of a first connecting portion.

The first electrode portion 11 is composed of a metal film such as a metal, and is arranged on an opposing surface 101 that opposes the second semiconductor chip 20.

The first protective film 12 is composed of an insulating film such as a silicone oxide film ($SiO_2$), and is arranged in a portion that covers the first electrode portion 11 and opposes the second semiconductor chip 20, and in a bottom portion thereof there is provided a first hole portion 122 in which the first electrode portion 11 is exposed. In detail, the first protective film 12 has a first protruding portion 121 that protrudes from an opening edge portion of the first hole portion 122 toward the second semiconductor chip 20, and the first hole portion 122 is provided in a tip end portion opposing the second semiconductor chip 20 of this first protruding portion 121.

The first bump 13 is a concave metal film composed of gold (Au), for example, is provided in the first hole portion 122, and protrudes from the first hole portion 122 toward a second hole portion 222 of the second semiconductor chip 20 described later (in other words, downward in FIG. 1). In detail, the first bump 13 has a first portion 131 that is provided inside the first hole portion 122, and a second portion 132 that is provided on this first portion 131 and protrudes in a direction away from the first hole portion 122 along a front surface opposing the second semiconductor chip 20 of the first protective film 12 from the opening edge portion of the first hole portion 122.

Furthermore, an inserting-side recessed portion 133 that is an example of a recess is provided in a tip end portion opposing the second semiconductor chip 20 of the second portion 132 of the first bump 13.

The second semiconductor chip 20 has an electrically conductive second electrode portion 21, an insulating second protective film 22, and an electrically conductive second bump 23. It should be noted that the second bump 23 is an example of a second connecting portion.

The second electrode portion 21 is composed of a metal film such as a metal, and is arranged on an opposing surface 201 that opposes the first semiconductor chip 10.

The second protective film 22 is composed of an insulating film such as a silicon nitride film (SiN), and is arranged in a portion that covers the second electrode portion 21 and opposes the first semiconductor chip 10, and in a bottom portion thereof there is provided the second hole portion 222 in which the second electrode portion 21 is exposed. In detail, the second protective film 22 has a second protruding portion 221 that protrudes from an opening edge portion of the second hole portion 222 toward the first semiconductor chip 10, and the second hole portion 222 is provided in a tip end portion opposing the first semiconductor chip 10 of this second protruding portion 221.

The second bump 23 is a concave metal film composed of gold (Au), for example, is provided in the second hole portion 222, and protrudes from the second hole portion 222 toward the first hole portion 122 (in other words, upward in FIG. 1). In detail, the second bump 23 has a third portion 231 that is provided inside the second hole portion 222, and a fourth portion 232 that is provided on this third portion 231 and protrudes in a direction away from the second hole portion 222 along a front surface opposing the first semiconductor chip 10 of the second protective film 22 from the opening edge portion of the second hole portion 222.

Furthermore, an inserted-side recessed portion 233 that is an example of a recess into which the first bump 13 can be inserted is provided in a tip end portion opposing the first electrode portion 11 of the second bump 23. In the semiconductor device 1, a peripheral edge portion of the inserting-side recessed portion 133 in the tip end portion of the first bump 13 and the bottom portion of the inserted-side recessed portion 233 of the second bump 23 make contact, the first electrode portion 11 and the second electrode portion 21 are electrically connected, and the first semiconductor chip 10 and the second semiconductor chip 20 are thereby electrically connected.

It should be noted that the direction in which the first semiconductor chip 10 and the second semiconductor chip 20 oppose each other is taken as a first direction (the vertical direction in FIG. 1, in other words), the direction that is orthogonal to the first direction is taken as a second direction (the horizontal direction in FIG. 1, in other words), the maximum width in the second portion 132 of the first bump 13 in the second direction is taken as a first width W1, the maximum opening width of the second hole portion 222 in the second direction is taken as a second width W2, and the maximum width in the fourth portion 232 of the second bump 23 in the second direction is taken as a third width W3. The semiconductor device 1 is configured in such a way that the first width W1 is less than the second width W2 and the second width W2 is less than the third width W3. In other words, the relationship of third width W3>second width W2>first width W1 is established.

Next, a manufacturing method for the semiconductor device 1 will be described with reference to FIGS. 2 to 5.

Figure 2:
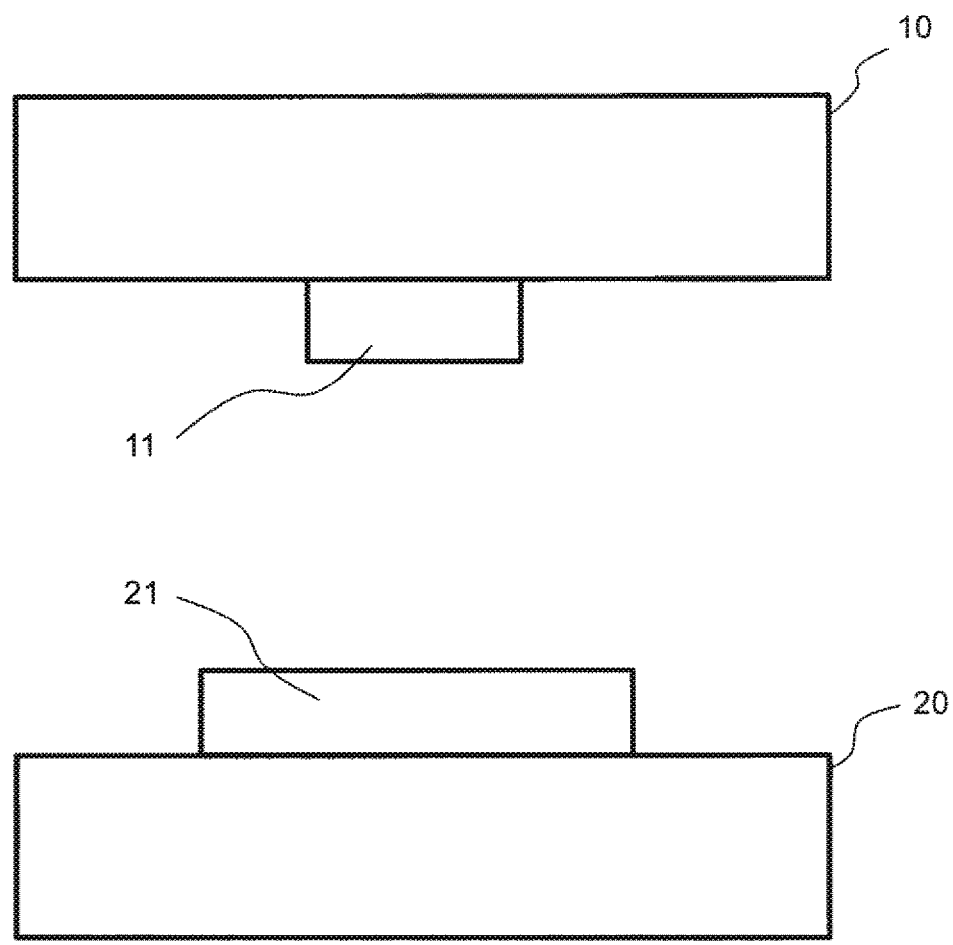
FIG. 2 is a schematic view for describing a manufacturing step for the semiconductor device of FIG. 1.
Figure 3:
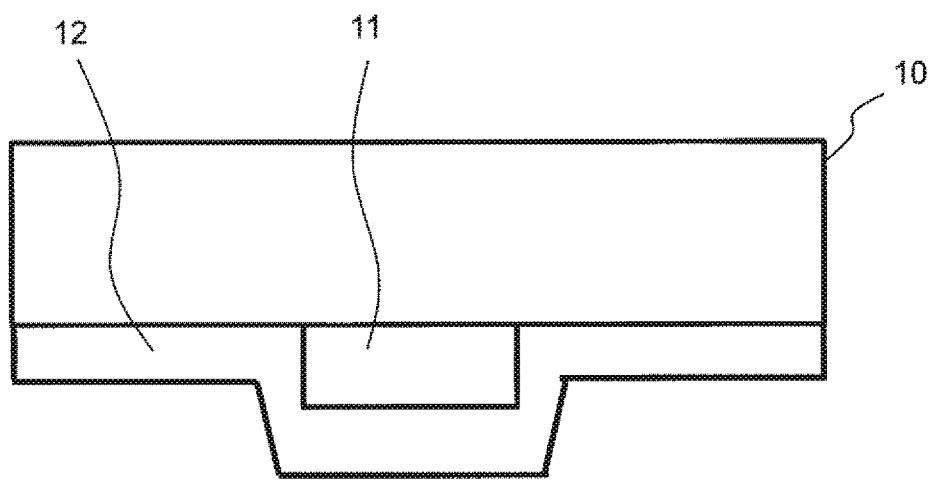
FIG. 3 is a schematic view for describing a manufacturing step for the semiconductor device of FIG. 1, in continuation from FIG. 2.
Figure 3:
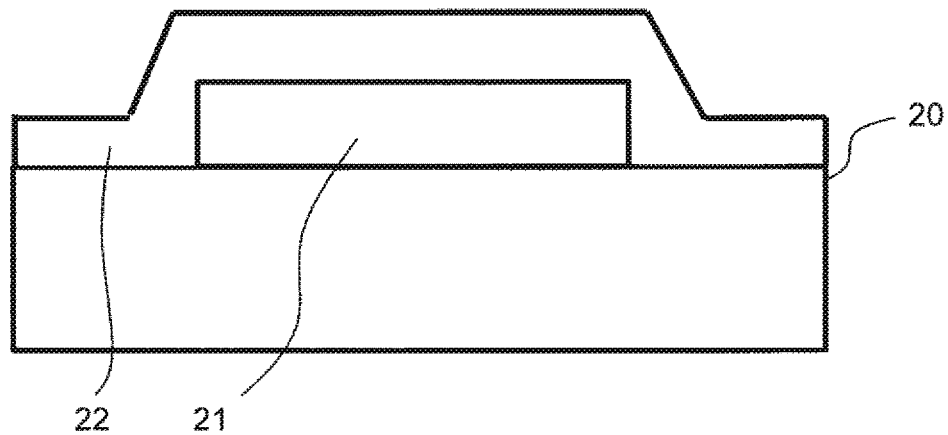
Figure 4:
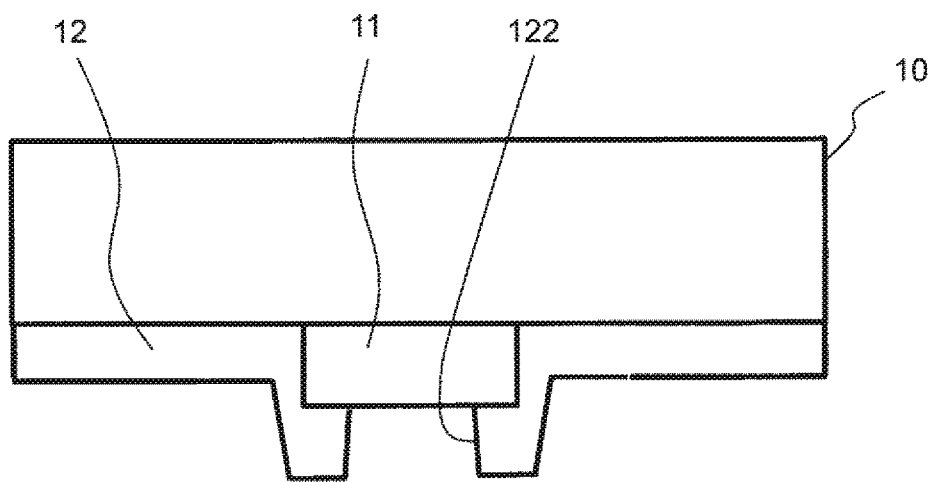
FIG. 4 is a schematic view for describing a manufacturing step for the semiconductor device of FIG. 1, in continuation from FIG. 3.
Figure 4:
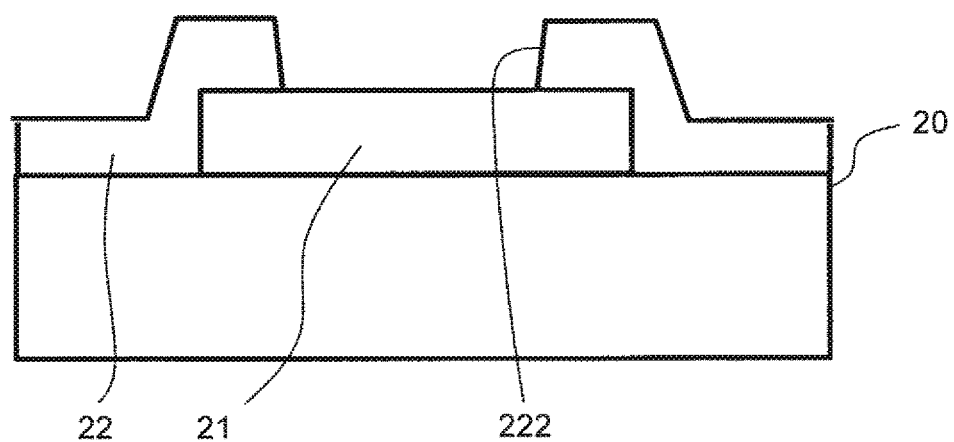

As depicted in FIGS. 2 to 4, the first electrode portion 11 is formed on the first semiconductor chip 10, the first protective film 12 is formed so as to cover the first electrode portion 11, and thereafter the first hole portion 122 is formed so that the first electrode portion 11 is exposed; meanwhile, the second electrode portion 21 is formed on the second semiconductor chip 20, the second protective film 22 is formed so as to cover the second electrode portion 21, and thereafter the second hole portion 222 is formed so that the second electrode portion 21 is exposed.

Figure 5:
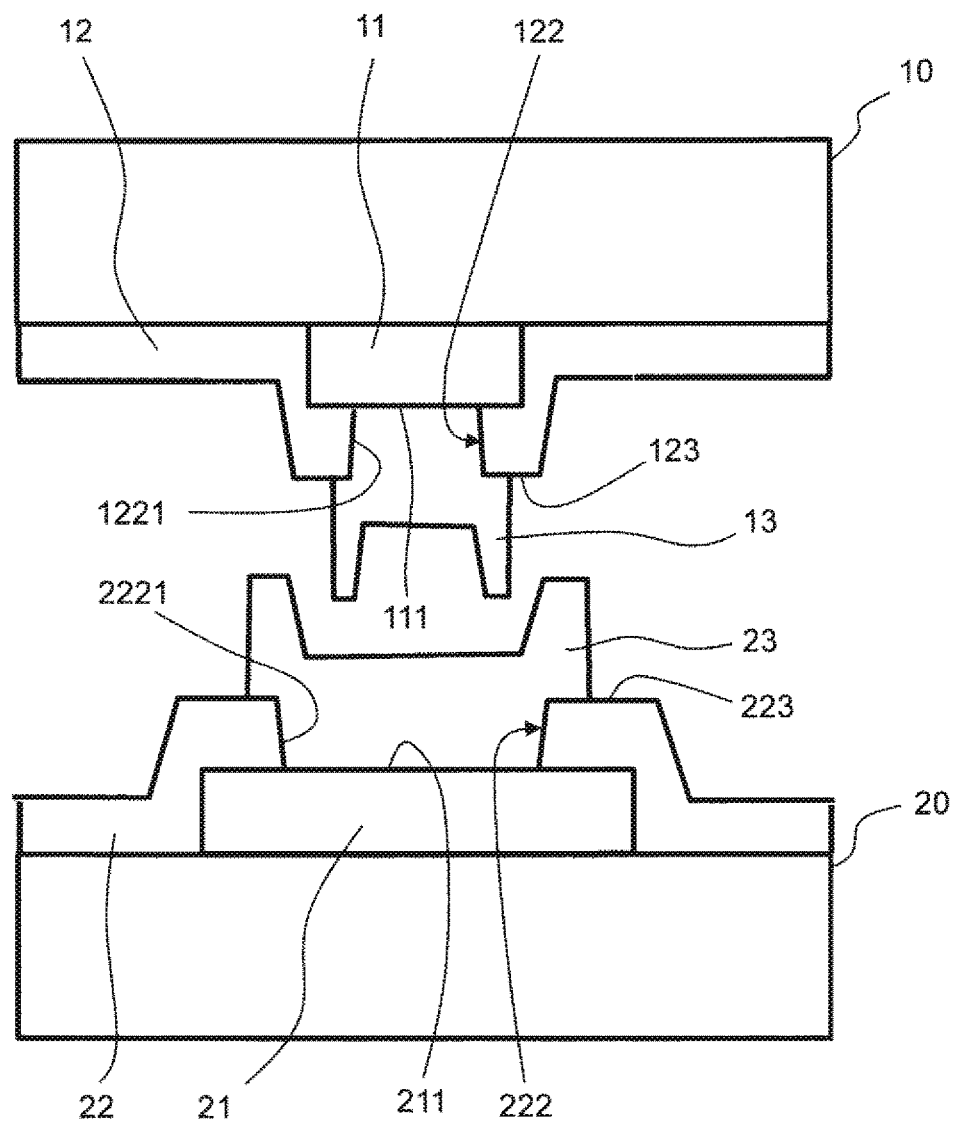
FIG. 5 is a schematic view for describing a manufacturing step for the semiconductor device of FIG. 1, in continuation from FIG. 4.

Next, as depicted in FIG. 5, a metal film is deposited over a front surface 111 of the first electrode portion 11, a side surface 1221 of the first hole portion 122, and a front surface 123 of the first protective film 12 to form the first bump 13; meanwhile, a metal film is deposited over a front surface 211 of the second electrode portion 21, a side surface 2221 of the second hole portion 222, and a front surface 223 of the second protective film 22 to form the second bump 23 composed of a concave metal film.

The first bump 13 is then inserted into the recess 233 in the second bump 23, and the first semiconductor chip 10 and the second semiconductor chip 20 are laminated. The laminated first semiconductor chip 10 and second semiconductor chip 20 are heated, the first bump 13 and the second bump 23 are joined, and the manufacturing of the semiconductor device 1 depicted in FIG. 1 is finished.

In this way, according to the manufacturing method for the semiconductor device 1, the second bump 23 composed of a concave metal film is formed by a metal film being deposited on the front surface of the second electrode portion 21, the side surface of the second hole portion 222, and the front surface of the second protective film 22, and therefore it is not necessary to form a hole for forming the second bump 23, and the manufacturing process can be simplified. Consequently, the semiconductor device 1 can be easily manufactured.

In other words, in the semiconductor device 1, the second bump 23 composed of a concave metal film can be formed by a metal film being deposited on the front surface of the second electrode portion 21, the side surface of the second hole portion 222, and the front surface of the second protective film 22, for example, and therefore the manufacturing process can be simplified with a hole forming step for forming the second bump 23 being omitted. As a result, it is possible to provide a semiconductor device 1 that can be easily manufactured.

Furthermore, the first bump 13 is composed of a concave metal film formed on the front surface of the first electrode portion 11, the side surface of the first hole portion 122, and the front surface of the first protective film 12. It is thereby possible to simplify the manufacturing process with a hole forming step for forming the first bump 13 being omitted.

Furthermore, the width W2 of the second hole portion 222 is less than the width W3 of the second bump 23 and is greater than the width W1 of the first bump 13. It is thereby possible to easily align the first semiconductor chip 10 and the second semiconductor chip 20. This is particularly effective when the semiconductor device 1 has a bump structure that conforms with microbumps.

Furthermore, the manufacturing method for the semiconductor device 1 has a step in which the first bump 13 is inserted into the inserted-side recessed portion 233 of the second bump 23 and the first semiconductor chip 10 and the second semiconductor chip 20 are laminated, and a step in which the laminated first semiconductor chip 10 and second semiconductor chip 20 are heated and the first bump 13 and the second bump 23 are joined. It is thereby possible for the first semiconductor chip 10 and the second semiconductor chip 20 to be heated and joined after having been finely aligned. Therefore, a high-precision semiconductor device 1 can be obtained even when materials having different coefficients of thermal expansion are used for the first semiconductor chip 10 and the second semiconductor chip 20, for example.

It should be noted that the first width W1, the second width W2, and the third width W3 are not restricted to having the relationship of third width W3>second width W2>first width W1, and may have the relationship third width W3 first width W1. For example, the relationship of third width W3>first width W1>second width W2 may be established. In this case, a side surface 2331 of the inserted-side recessed portion 233 of the second bump 23 of the second semiconductor chip 20 is an inclined surface that approaches the center toward the bottom surface thereof, and the side surface of the first bump 13 of the first semiconductor chip 10 makes contact with this inclined surface. It is thereby possible to increase the joining strength between the first bump 13 and the second bump 23.

Furthermore, the first bump 13 and the second bump 23 may be joined by heating and pressurizing the laminated first semiconductor chip 10 and second semiconductor chip 20.

The present invention can also be applied in MEMS (microelectromechanical systems), for example.

Second Embodiment

Figure 6:
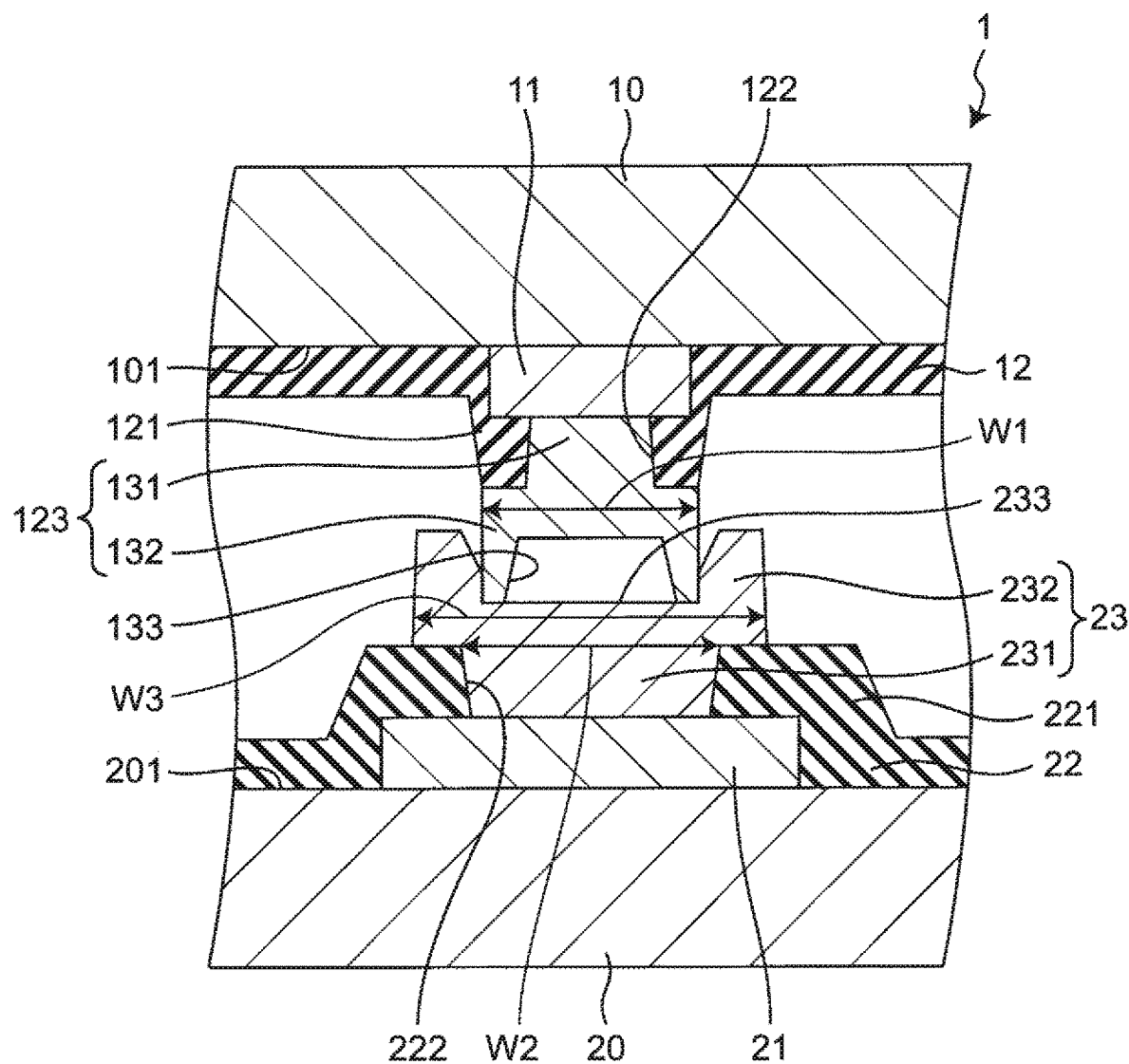
FIG. 6 is a cross-sectional schematic view of a semiconductor device of a second embodiment of the present invention.

The semiconductor device 1 of a second embodiment of the present invention is different from the semiconductor device 1 of the first embodiment in being configured in such a way that the first bump 13 is able to make contact with the bottom portion and the inside portion of the inserted-side recessed portion 233 of the second bump 23, as depicted in FIG. 6.

In this way, by configuring the first bump 13 in such a way as to be able to make contact with the bottom portion and the inside portion of the inserted-side recessed portion 233 of the second bump 23, it is possible to increase the joining strength between the first bump 13 and the second bump 23.

Third Embodiment

Figure 7:
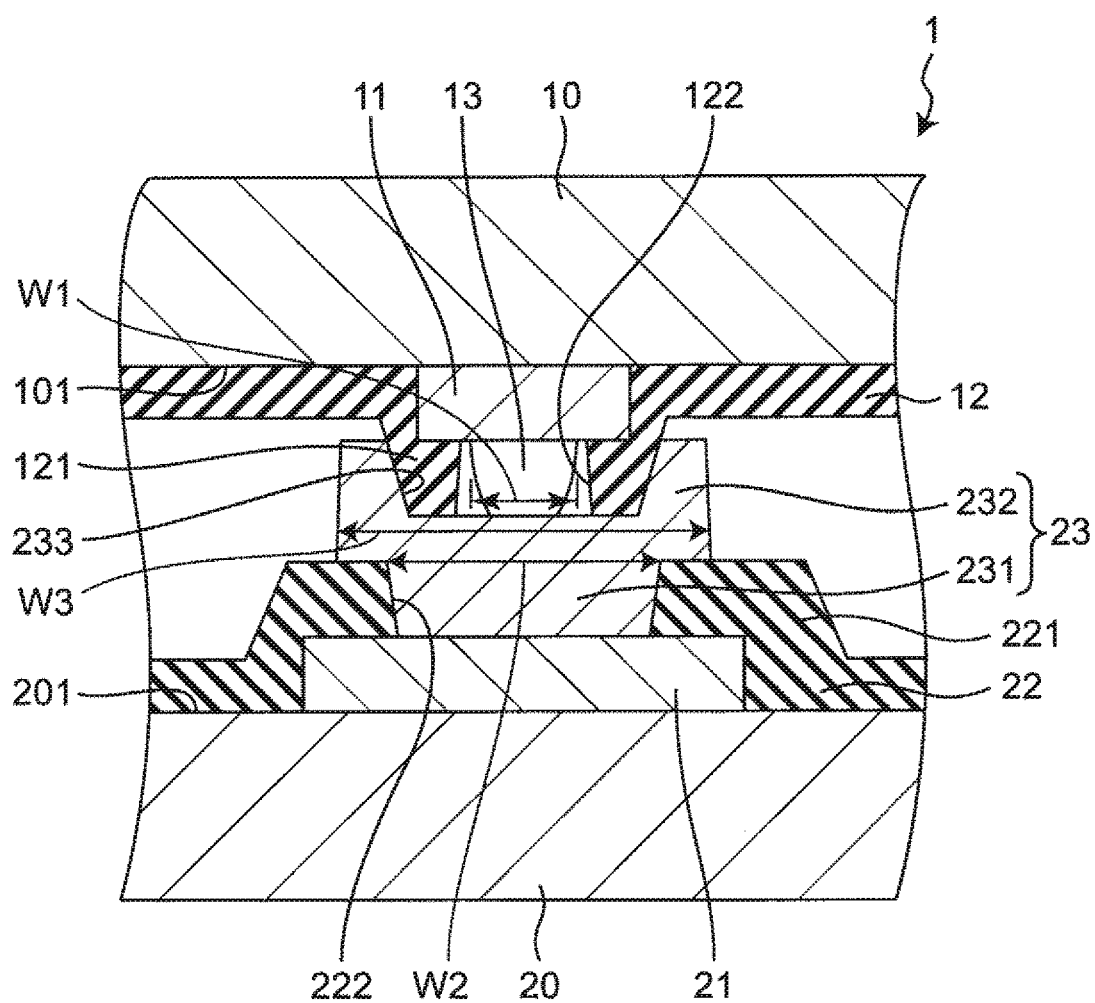
FIG. 7 is a cross-sectional schematic view of a semiconductor device of a third embodiment of the present invention.

The semiconductor device 1 of a third embodiment of the present invention is different from the semiconductor device 1 of the first embodiment in being configured in such a way that the protruding portion (in other words, a fitting protruding portion) 121 of the first protective film 12 is able to protrude from the opening edge portion of the first hole portion 122 toward the second semiconductor chip 20, and an outside portion thereof is able to make contact with the inside portion of the inserted-side recessed portion 233 of the second bump 23 and fit together with the inserted-side recessed portion 233, as depicted in FIG. 7.

In this way, by providing the first protective film 12 with a fitting protruding portion 121 that is able to protrude from the opening edge portion of the first hole portion 122 toward the second semiconductor chip 20, and an outside portion thereof is able to make contact with the inside portion of the inserted-side recessed portion 233 of the second bump 23 and fit together with the inserted-side recessed portion 233, it is possible to increase the joining strength between the first bump 13 and the second bump 23.

In the semiconductor device 1 of the third embodiment, the inserting-side recessed portion 133 is not provided in the first bump 13; however, it should be noted that there is no restriction thereto, and the inserting-side recessed portion 133 may be provided as in the first bump 13 of the semiconductor device 1 of the first embodiment.

Furthermore, in the semiconductor device 1 of the third embodiment, the first bump 13 is provided in such a way that a gap is formed with an outside portion of the first hole portion 122; however, there is no restriction thereto. For example, the first bump 13 may be provided so as to make contact with the outside portion of the first hole portion 122 (in other words, in the entire inside of the first hole portion 122).

Other Embodiments

In the semiconductor device 1 depicted in FIG. 7, the fitting protruding portion 121 of the first protective film 12 is not restricted to being configured to be able to fit together with the inserted-side recessed portion 233 of the second bump 23. For example, the fitting protruding portion 121 may be configured to be able to be inserted so that a gap is formed between an outside portion thereof and an inside portion of the inserted-side recessed portion 233 of the second bump 23. In this case, the fitting protruding portion 121 of the first protective film 12 may be inserted into the inserted-side recessed portion 233 of the second bump 23 and arranged inside the inserted-side recessed portion 233, or may be arranged outside of the inserted-side recessed portion 233 as in the first embodiment.

Furthermore, in the semiconductor device 1 depicted in FIG. 7, the first bump 13 is not restricted to being provided so that a gap is formed with the outside portion of the first hole portion 122, and may be composed of a first portion that is provided inside the first hole portion 122 and a second portion that is provided on this first portion and protrudes in a direction away from the first hole portion 122 along a front surface opposing the second semiconductor chip 20 of the first protective film 12 from the opening edge portion of the first hole portion 122. At such time, the second portion can be made to protrude so as to cover some or all of the front surface opposing the second semiconductor chip 20 of the first protective film 12 at the tip end portion of the second protruding portion 221 of the second protective film 22.

Fourth Embodiment

Figure 8:
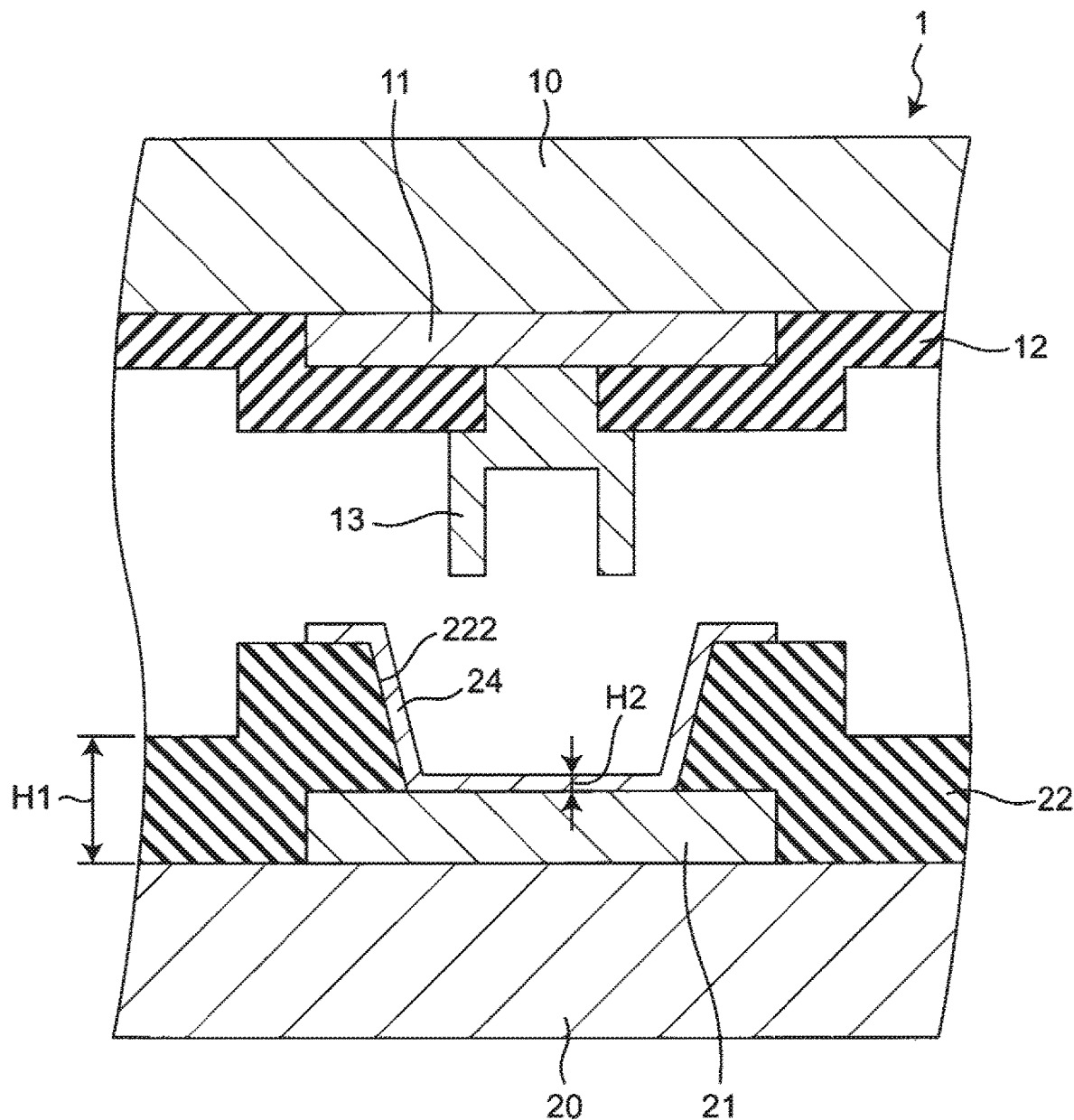
FIG. 8 is a cross-sectional schematic view of a semiconductor device of a fourth embodiment of the present invention.

The second connecting portion is not restricted to being the second bump 23. For example, as depicted in FIG. 8, the second connecting portion may be a concave metal film 24 having a film thickness H2 that is less than a film thickness H1 of the second protective film 22. It should be noted that FIG. 8 depicts the state prior to the first bump 13 and the concave metal film 24 being connected.

Fifth Embodiment

Figure 9:
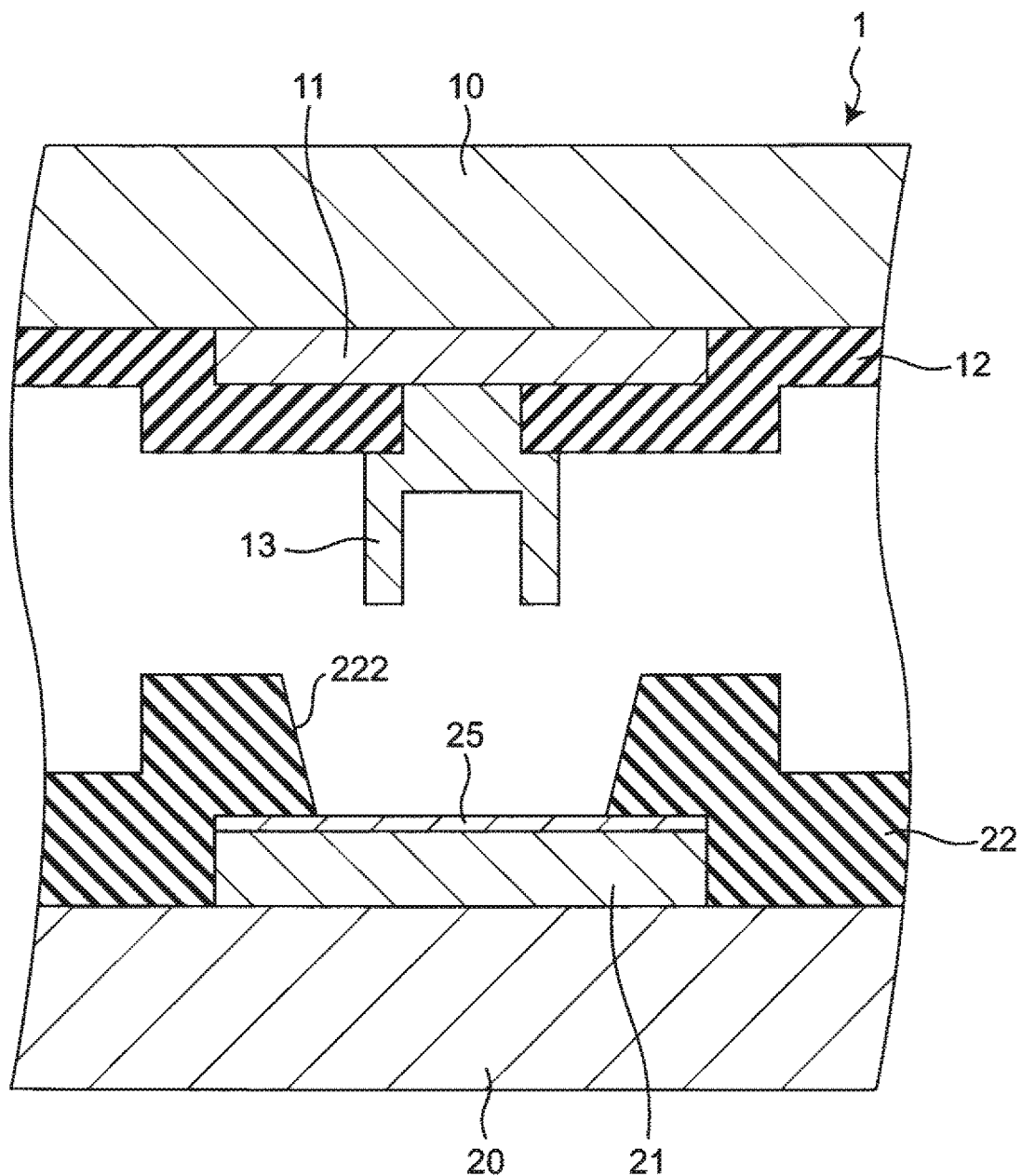
FIG. 9 is a cross-sectional schematic view of a semiconductor device of a fifth embodiment of the present invention.

It should be noted that the second connecting portion is not restricted to being a concave metal film formed on the front surface of the second electrode portion 21, the side surface of the second hole portion 222, and the front surface of the second protective film 22, and, for example, may be a metal film 25 that is formed on only the front surface of the second electrode portion 21 as depicted in FIG. 9. It should be noted that FIG. 9 depicts the state prior to the first bump 13 and the metal film 25 being connected.

Sixth Embodiment

Figure 10:
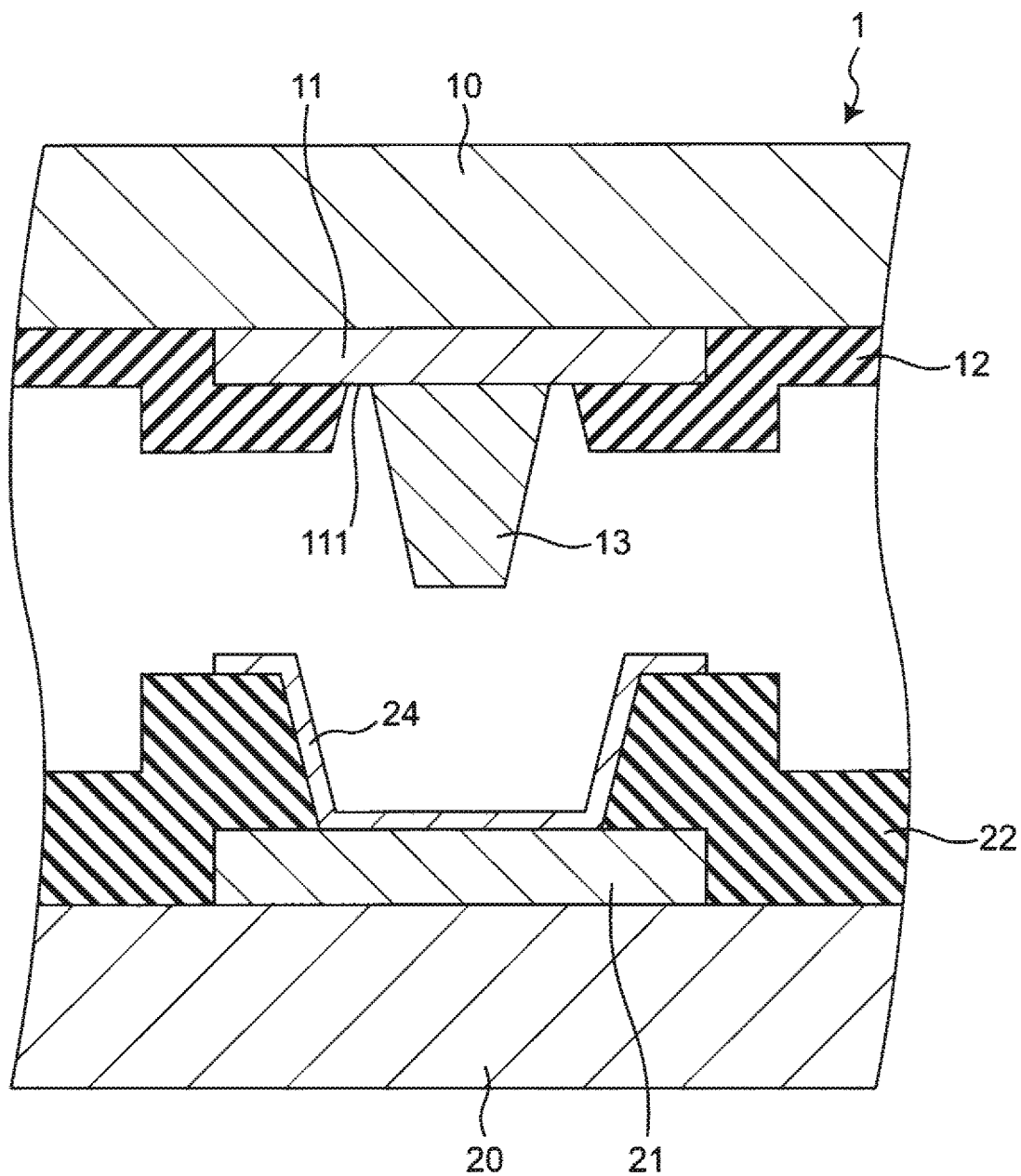
FIG. 10 is a cross-sectional schematic view of a semiconductor device of a sixth embodiment of the present invention.

The first bump 13 is not restricted to being composed of a concave metal film formed on the front surface 111 of the first electrode portion 11, the side surface 1221 of the first hole portion 122, and the front surface 123 of the first protective film 12. For example, the first bump 13 may be composed of a convex metal film that protrudes from the front surface 111 of the first electrode portion 11 toward the second electrode portion 21, as depicted in FIG. 10. It should be noted that FIG. 10 depicts the state prior to the first bump 13 and the concave metal film 24 being connected.

Seventh Embodiment

Figure 11:
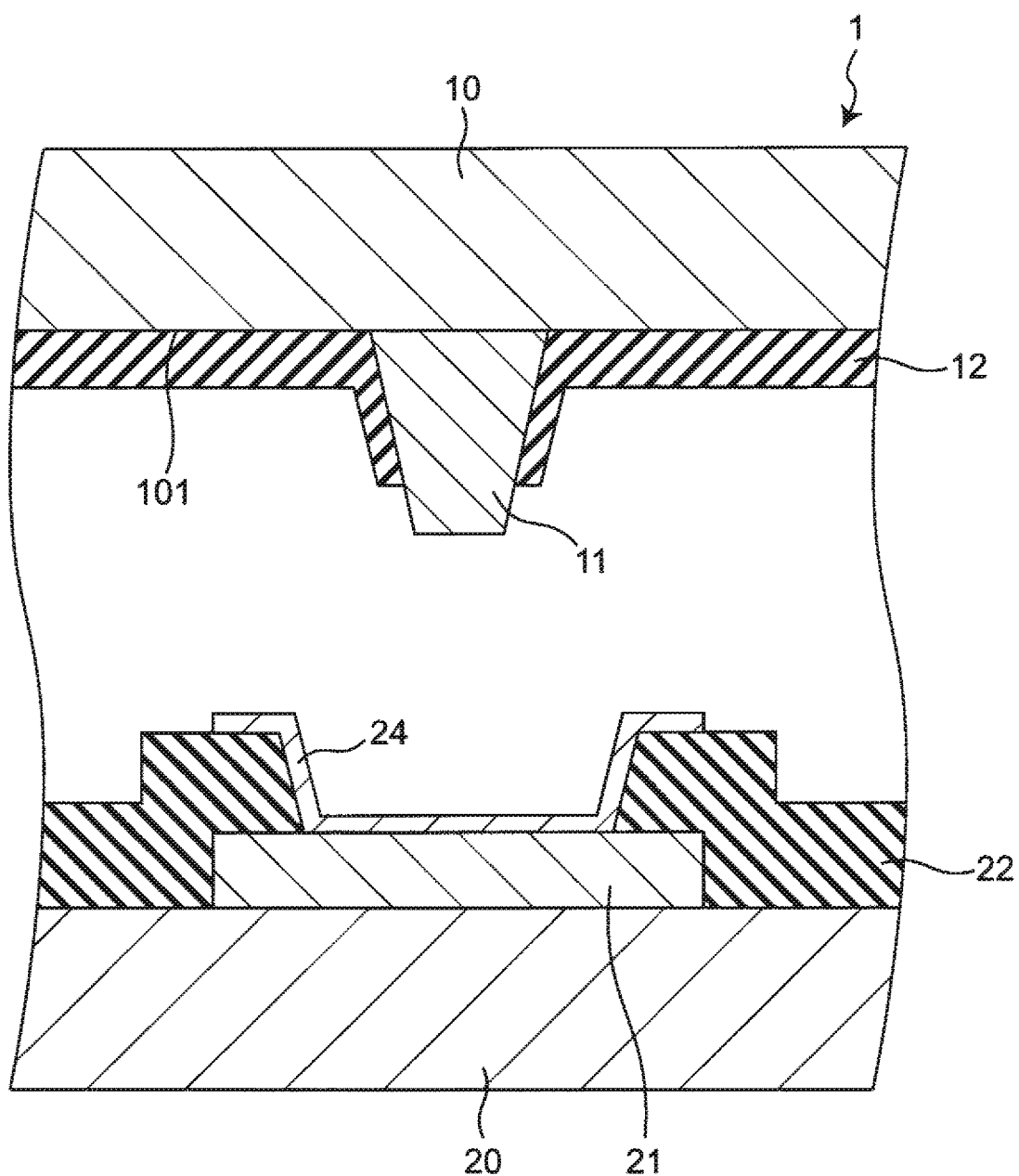
FIG. 11 is a cross-sectional schematic view of a semiconductor device of a seventh embodiment of the present invention.

The first connecting portion is not restricted to being the electrically conductive first bump 13 that protrudes from the first hole portion 122 toward the second hole portion 222, and, for example, may be a convex first electrode portion 11 that protrudes from the opposing surface 101 of the first semiconductor chip 10 toward the second semiconductor chip 20, as depicted in FIG. 11. It should be noted that FIG. 11 depicts the state prior to the first electrode portion 11 and the concave metal film 24 being connected.

Hereinabove, one embodiment in the present invention has been described in detail with reference to the drawings; however, lastly, various embodiments of the present invention will be described. It should be noted that, in the description given hereinafter, reference signs are also appended as an example.

A semiconductor device 1 of one embodiment of the present invention is provided with a first semiconductor chip 10 and a second semiconductor chip 20 arranged so as to oppose each other,
the first semiconductor chip 10 having:
a first electrode portion 11 that is provided on an opposing surface 101 that opposes the second semiconductor chip 20; and
a first protective film 12 that is arranged in a portion opposing the second semiconductor chip 20 and is provided with a first hole portion 122 in which the first electrode portion 11 is exposed, and
the second semiconductor chip 20 having:
a second electrode portion 21 that is provided on an opposing surface 201 that opposes the first semiconductor chip 10; and
a second protective film 22 that is arranged in a portion opposing the first semiconductor chip 10 and is provided with a second hole portion 222 in which the second electrode portion 21 is exposed,
in which the first semiconductor chip 10 has an electrically conductive first bump 13 that is provided in the first hole portion 122 and protrudes from the first hole portion 122 toward the second hole portion 222,
the second semiconductor chip 20 has an electrically conductive second bump 23 that is composed of a concave metal film formed on a front surface of the second electrode portion 21, a side surface of the second hole portion 222, and a front surface of the second protective film 22, and
the first electrode portion 11 and the second electrode portion 21 are electrically connected via the first bump 13 and the second bump 23.

According to the semiconductor device 1 of the aforementioned embodiment, the second bump 23 composed of a concave metal film can be formed by a metal film being deposited on the front surface 211 of the second electrode portion 21, the side surface 2221 of the second hole portion 222, and the front surface 223 of the second protective film 22, and therefore the manufacturing process can be simplified with a hole forming step for forming the second bump 23 being omitted. As a result, it is possible to provide a semiconductor device 1 that can be easily manufactured.

In the semiconductor device 1 of one embodiment of the present invention,
the first bump 13 is composed of a concave metal film formed on a front surface 111 of the first electrode portion 11, a side surface 1221 of the first hole portion 122, and a front surface 123 of the first protective film 12.

According to the semiconductor device 1 of the aforementioned embodiment, it is possible to simplify the manufacturing process with a hole forming step for forming the first bump 13 being omitted.

In the semiconductor device 1 of one embodiment of the present invention,
a width W2 of the second hole portion 222 is less than a width W3 of the second bump 23 and greater than a width W1 of the first bump 13.

According to the semiconductor device 1 of the aforementioned embodiment, it is possible to easily align the first semiconductor chip 10 and the second semiconductor chip 20.

In the semiconductor device 1 of one embodiment of the present invention,
the first bump 13 is configured to be able to make contact with a bottom surface and an inner surface in a recess 233 of the second bump 23.

According to the semiconductor device 1 of the aforementioned embodiment, it is possible to increase the joining strength between the first bump 13 and the second bump 23.

In the semiconductor device 1 of one embodiment of the present invention,
the first protective film 12 has a fitting protruding portion 121 that is able to fit together with a recess 233 of the first bump 13.

According to the semiconductor device 1 of the aforementioned embodiment, it is possible to increase the joining strength between the first bump 13 and the second bump 23.

In a manufacturing method for the semiconductor device 1 of one embodiment of the present invention,
the semiconductor device 1 is provided with a first semiconductor chip 10 and a second semiconductor chip 20 arranged so as to oppose each other,
the first semiconductor chip 10 has:
a first electrode portion 11 that is provided on an opposing surface 101 that opposes the second semiconductor chip 20, and
a first protective film 12 that is arranged in a portion opposing the second semiconductor chip 20 and is provided with a first hole portion 122 in which the first electrode portion 11 is exposed,
the second semiconductor chip 20 has:
a second electrode portion 21 that is provided on an opposing surface 201 that opposes the first semiconductor chip 10; and
a second protective film 22 that is arranged in a portion opposing the first semiconductor chip 10 and is provided with a second hole portion 222 in which the second electrode portion 21 is exposed,
the first semiconductor chip 10 has an electrically conductive first bump 13 that is provided in the first hole portion 122 and protrudes from the first hole portion 122 toward the second hole portion 222,
the second semiconductor chip 20 has an electrically conductive second bump 23 that is composed of a concave metal film formed on a front surface 211 of the second electrode portion 21, a side surface 2221 of the second hole portion 222, and a front surface 223 of the second protective film 22, and the first electrode portion 11 and the second electrode portion 21 are electrically connected via the first bump 13 and the second bump 23, in which the manufacturing method includes:

a step in which the first electrode portion 11 is formed on the first semiconductor chip 10, the first protective film 12 is formed so as to cover the first electrode portion 11, and thereafter the first hole portion 122 is formed so that the first electrode portion 11 is exposed;

a step in which the second electrode portion 21 is formed on the second semiconductor chip 20, the second protective film 22 is formed so as to cover the second electrode portion 21, and thereafter the second hole portion 222 is formed so that the second electrode portion 21 is exposed;

a step in which a metal film is deposited in the first hole portion 122 to form the first bump 13; and a step in which a metal film is deposited on the front surface 211 of the second electrode portion 21, the side surface 2221 of the second hole portion 222, and the front surface 223 of the second protective film 22 to form the second bump.

According to the manufacturing method for the semiconductor device of the aforementioned embodiment, the second bump 23 composed of a concave metal film is formed by a metal film being deposited on the front surface 211 of the second electrode portion 21, the side surface 2221 of the second hole portion 222, and the front surface 223 of the second protective film 22, and therefore it is not necessary to form a hole for forming the second bump 23, and the manufacturing process can be simplified. Consequently, the semiconductor device 1 can be easily manufactured.

The manufacturing method for the semiconductor device 1 of one embodiment of the present invention includes:

a step in which the first bump 13 is inserted into a recess 233 of the second bump 23, and the first semiconductor chip 10 and the second semiconductor chip 20 are laminated; and a step in which the first semiconductor chip 10 and the second semiconductor chip 20 that have been laminated are heated, and the first bump 13 and the second bump 23 are joined.

According to the manufacturing method for the semiconductor device of the aforementioned embodiment, it is possible for the first semiconductor chip 10 and the second semiconductor chip 20 to be heated and joined after having been finely aligned. Therefore, a high-precision semiconductor device 1 can be obtained even when materials having different coefficients of thermal expansion are used for the first semiconductor chip 10 and the second semiconductor chip 20, for example.

It should be noted that the respective effects of the aforementioned various embodiments or modified examples can be demonstrated by combining arbitrary embodiments or modified examples from thereamong as appropriate.

Furthermore, combinations of embodiments, combinations of examples, or combinations of embodiments and examples are possible, and also combinations of features from within different embodiments or examples are also possible.

REFERENCE SIGNS LIST

1 Semiconductor device
10 First semiconductor chip
11 First electrode portion
12 First protective film
121 First protruding portion
122 First hole portion
13 First bump
131 First portion
132 Second portion
133 Inserting-side recessed portion
20 Second semiconductor chip
21 Second electrode portion
22 Second protective film
221 Second protruding portion
222 Second hole portion
23 Second bump
231 Third portion
232 Fourth portion
233 Inserted-side recessed portion
24 Concave metal film
25 Metal film

The invention claimed is:

1. A semiconductor device comprising a first semiconductor chip and a second semiconductor chip arranged so as to oppose each other, the first semiconductor chip having:

a first electrode portion that is provided on an opposing surface that opposes the second semiconductor chip; and a first protective film that is arranged in a portion opposing the second semiconductor chip and is provided with a first hole portion in which the first electrode portion is exposed, and the second semiconductor chip having:

a second electrode portion that is provided on an opposing surface that opposes the first semiconductor chip; and a second protective film that is arranged in a portion opposing the first semiconductor chip and is provided with a second hole portion in which the second electrode portion is exposed, wherein the first semiconductor chip has a first connecting portion that is electrically conductive, the first connecting portion is provided in the first hole portion, protrudes from the first hole portion toward the second hole portion, and has a first recessed portion denting to the first hole portion side on a first tip end portion of the first connecting portion, the second semiconductor chip has a second connecting portion that is electrically conductive, the second connecting portion is formed on a front surface of the second electrode portion, a side surface of the second hole portion, and a front surface of the second protective film, the second connecting portion protrudes from the second hole portion toward the first hole portion, and has a second recessed portion denting to the second hole portion side on a second tip end portion of the second connecting portion, the first tip end portion makes contact with a bottom surface of the second recessed portion of the second connecting portion so that the first electrode portion and the second electrode portion are electrically connected, and a closed space is formed by an inner surface of the first recessed portion and the bottom surface of the second recessed portion.

2. The semiconductor device of claim 1, wherein the first connecting portion is formed on a front surface of the first electrode portion, a side surface of the first hole portion, and a front surface of the first protective film.

3. The semiconductor device of claim 1, wherein a width of the second hole portion is less than a width of the second connecting portion and greater than a width of the first connecting portion.

4. The semiconductor device of claim 1, wherein the first connecting portion is configured to make contact with the bottom surface and an inner surface in the second recessed portion of the second connecting portion.

5. A semiconductor device comprising a first semiconductor chip and a second semiconductor chip arranged so as to oppose each other, the first semiconductor chip having:

a first electrode portion that is provided on an opposing surface that opposes the second semiconductor chip; and a first protective film that is arranged in a portion opposing the second semiconductor chip and is provided with a first hole portion in which the first electrode portion is exposed, and the second semiconductor chip having:

a second electrode portion that is provided on an opposing surface that opposes the first semiconductor chip; and a second protective film that is arranged in a portion opposing the first semiconductor chip and is provided with a second hole portion in which the second electrode portion is exposed, wherein the first semiconductor chip has a first connecting portion that is electrically conductive, is provided in the first hole portion, and protrudes from the first hole portion toward the second hole portion, the second semiconductor chip has a second connecting portion that is electrically conductive, and comprises a concave metal film formed on a front surface of the second electrode portion, a side surface of the second hole portion, and a front surface of the second protective film, and the first electrode portion and the second electrode portion are electrically connected via the first connecting portion and the second connecting portion, wherein the first protective film has a fitting protruding portion that is able to fit together with a recess of the second connecting portion, and a space is formed between the first protective film and the second protective film.

6. The semiconductor device of claim 2, wherein a width of the second hole portion is less than a width of the second connecting portion and greater than a width of the first connecting portion.

7. The semiconductor device of claim 2, wherein the first connecting portion is configured to make contact with the bottom surface and an inner surface in the second recessed portion of the second connecting portion.

8. The semiconductor device of claim 3, wherein the first connecting portion is configured to make contact with the bottom surface and an inner surface in the second recessed portion of the second connecting portion.

9. The semiconductor device of claim 6, wherein the first connecting portion is configured to make contact with the bottom surface and an inner surface in the second recessed portion of the second connecting portion.

\* \* \* \* \*